(12) United States Patent
Yabuki

(10) Patent No.: US 10,996,528 B2
(45) Date of Patent: May 4, 2021

(54) DISPLAY DEVICE

(71) Applicant: SAKAI DISPLAY PRODUCTS CORPORATION, Sakai (JP)

(72) Inventor: Haruhito Yabuki, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/606,483

(22) PCT Filed: Jun. 22, 2017

(86) PCT No.: PCT/JP2017/023066
§ 371 (c)(1),
(2) Date: Oct. 18, 2019

(87) PCT Pub. No.: WO2018/235237
PCT Pub. Date: Dec. 27, 2018

(65) Prior Publication Data
US 2020/0183239 A1   Jun. 11, 2020

(51) Int. Cl.
*G02F 1/1362* (2006.01)
*G09G 3/36* (2006.01)
*H01L 27/12* (2006.01)

(52) U.S. Cl.
CPC ..... *G02F 1/136286* (2013.01); *G09G 3/3648* (2013.01); *H01L 27/124* (2013.01); *G09G 2310/027* (2013.01)

(58) Field of Classification Search
CPC ............ G02F 1/136286; G09G 3/3648; G09G 2310/027; G09G 2320/0252; G09G 3/3688; G09G 3/20; G09G 3/36; H01L 27/124
See application file for complete search history.

(56) References Cited

U.S. PATENT DOCUMENTS

| | | | |
|---|---|---|---|
| 6,958,791 B2 | 10/2005 | Shimoshikiryo | |
| 6,985,130 B2* | 1/2006 | Nakayoshi | G09G 3/3225 345/100 |
| 7,079,214 B2 | 7/2006 | Shimoshikiryo | |
| 7,283,192 B2 | 10/2007 | Shimoshikiryo | |
| 7,573,453 B2 | 8/2009 | Lee et al. | |

(Continued)

FOREIGN PATENT DOCUMENTS

| | | |
|---|---|---|
| JP | 2004062146 A | 2/2004 |
| JP | 2009224869 A | 10/2009 |

(Continued)

*Primary Examiner* — Bryan Earles
(74) *Attorney, Agent, or Firm* — ScienBiziP, P.C.

(57) ABSTRACT

This display device is provided with: a plurality of pixels (3); a plurality of source lines (SL); a source drive circuit (12*a*); and a plurality of switches (40, 41). The plurality of pixels are arranged in a matrix, and form a display region (10*a*) in which an image is displayed. The plurality of source lines (SL) are wired in the row direction of the pixel matrix on the display region, and connected to the respective pixels. The source drive circuit has a plurality of signal lines (PL) through which signals supplied to the respective pixels via the source lines are outputted. The switches are provided between the source lines and the signal lines. More than one of the source lines are wired to the pixels in the same row in the matrix. The source lines (SLe, SLo) for pixels in the same row and one of the signal lines of the source drive circuit, are connected via the switches.

11 Claims, 13 Drawing Sheets

(56) References Cited

U.S. PATENT DOCUMENTS

| | | |
|---|---|---|
| 7,948,295 B2 | 5/2011 | Yamashita |
| RE45,283 E | 12/2014 | Shimoshikiryo |
| RE46,025 E | 6/2016 | Shimoshikiryo |
| 9,514,693 B2 | 12/2016 | Yoshida et al. |
| RE47,660 E | 10/2019 | Shimoshikiryo |
| 2003/0227429 A1 | 12/2003 | Shimoshikiryo |
| 2004/0119672 A1* | 6/2004 | Lee .................... G09G 3/3688 345/87 |
| 2005/0213015 A1 | 9/2005 | Shimoshikiryo |
| 2006/0097971 A1 | 5/2006 | Lee et al. |
| 2006/0256271 A1 | 11/2006 | Shimoshikiryo |
| 2009/0273388 A1 | 11/2009 | Yamashita |
| 2013/0127796 A1* | 5/2013 | Li ...................... G09G 3/3648 345/204 |
| 2014/0210877 A1 | 7/2014 | Li et al. |
| 2015/0221266 A1 | 8/2015 | Yoshida et al. |
| 2016/0171938 A1* | 6/2016 | Na ...................... G09G 3/3688 345/698 |

FOREIGN PATENT DOCUMENTS

| | | |
|---|---|---|
| JP | 4854207 B2 | 1/2012 |
| JP | 2014146028 A | 8/2014 |
| WO | 2014042074 A1 | 3/2014 |

\* cited by examiner

DISPLAY DEVICE

TECHNICAL FIELD

The present invention relates to a display device such as a liquid-crystal display.

BACKGROUND ART

In display devices using a liquid-crystal panel, there is a known technology for controlling an image to be displayed in an easy-to-see manner, for securing a viewing angle in the liquid-crystal panel and so on (for example, Patent Literature 1).

Patent Literature 1 discloses a technology for realizing a liquid-crystal display device with prominent visibility. In the liquid-crystal display device of Patent Literature 1, pixels for displaying an image are classified into main-pixels and sub-pixels. In Patent Literature 1, when two kinds of pixels exhibit the same grayscale, a signal voltage for each pixel of an image signal is controlled so that a voltage applied to a pixel electrode of a main-pixel is higher than a voltage applied to a pixel electrode of a sub-pixel.

CITATION LIST

Patent Literature

[Patent Literature 1] JP 4854207 B2

SUMMARY OF INVENTION

Technical Problem

An object of the present invention is to provide a display device capable of reducing circuit scale for displaying an image in an easy-to-see manner.

Solution to Problem

A display device according to an aspect of the present invention includes pixels, source lines, a source drive circuit, and switches. The pixels are arranged in a matrix and form a display area for displaying an image. The source lines are wired in a column direction of the matrix of the pixels on the display area and connected to the pixels. The source drive circuit includes signal lines that allow signals to be supplied therefrom to the pixels via the source lines. The switches are provided between the source lines and the signal lines. Of the source lines, prescribed source lines are wired to, of the pixels, prescribed pixels in an identical column of the matrix. The prescribed source lines to the prescribed pixels in the identical column are connected to one signal line of the signal lines of the source drive circuit via, of the switches, prescribed switches.

Advantageous Effects of Invention

The display device according to the aspect of the present invention enables a reduction in the circuit scale for displaying an image in an easy-to-see manner as a result of the prescribed source lines to the prescribed pixels in the identical column being consolidated and connected to the one signal line of the source drive circuit.

DESCRIPTION OF EMBODIMENTS

Display devices according to embodiments of the present invention will hereinafter be described with reference to the accompanying drawings. Note that similar elements are labelled with the same reference signs in the embodiments below.

First Embodiment

1. Configuration

A configuration of a display device according to a first embodiment will hereinafter be described.

Figure 1:
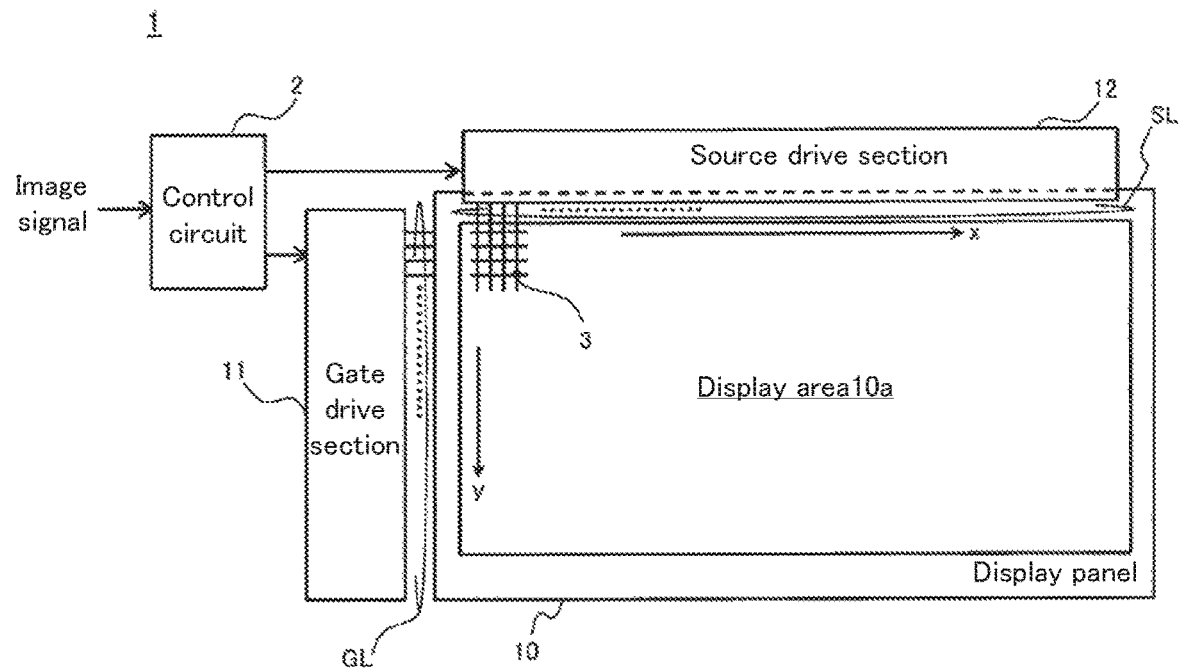
FIG. 1 illustrates a configuration of a display device according to a first embodiment.

The configuration of the display device according to the first embodiment will be described with reference to FIGS. 1 and 2. FIG. 1 illustrates the configuration of the display device 1 according to the present embodiment.

The display device 1 according to the present embodiment forms for example a liquid-crystal display such as liquid-crystal television. As illustrated in FIG. 1, the display device 1 includes a display panel 10, a gate drive section 11, a source drive section 12, and a control circuit 2.

The display panel 10 is for example an active-matrix liquid-crystal panel with prescribed specification such as 8K, 4K, or 2K. As illustrated in FIG. 1, the display panel 10 includes pixels 3, gate lines GL, and source lines SL. For example, the display panel 10 further includes a thin film transistor (TFT) substrate with pixel electrodes, a color filter (CF) substrate with counter electrodes, a liquid-crystal layer sealed between both the substrates, and a polarizing plate.

In the display panel 10, the pixels 3 are arranged in a matrix and form a display area 10a for displaying an image. In a row direction (x) of the matrix of the pixels 3 on the display area 10a, a side of +x and a side of −x may hereinafter be referred to as a right side and a left side, respectively. In a column direction (y) of the matrix, a side of +y and a side of −y may hereinafter be referred to as a lower side and an upper side, respectively.

The pixels 3 include respective active devices such as TFTs. The TFT of each pixel 3 includes a gate connected to a gate line GL and a source connected to a source line SL (see FIG. 3). The gate lines GL are signal lines that are wired in the row direction of the matrix of the pixels 3 and that are connected to, of the pixels 3, prescribed pixels 3 for each row. The source lines SL are signal lines wired in the column direction of the matrix of the pixels 3. The structure of the display panel 10 will be described in detail later.

The control circuit 2 includes one or more semiconductor integrated circuits such as LSI. The control circuit 2 is one example of a controller of the display device 1. The control circuit 2 functions as a timing controller and generates various signals for controlling respective operation timings of components of the display device 1. The control circuit 2 may control an overall operation of the display device 1.

For example, the control circuit 2 generates control signals for the gate drive section 11 and the source drive section 12 based on an image signal entered from an outside so that prescribed pixels for each row sequentially represent respective grayscales in a corresponding row of a frame image indicated by an image signal. In addition to the control of respective operation timings of the gate drive section 11 and the source drive section 12, the control circuit 2 performs predetermined image signal processing. The configuration of the control circuit 2 will be described in detail later.

According to control by the control circuit 2, the gate drive section 11 drives the gate lines GL at predetermined frame intervals (for example 1/60 second) by generating gate signals for sequentially selecting between respective gate lines GL in the rows of the matrix of the pixels 3. The gate drive section 11 includes for example ICs respectively connected with the gate lines GL.

According to control by the control circuit 2, the source drive section 12 supplies the source lines SL with respective source signals each of which has a voltage according to a grayscale to be represented for each pixel 3 in synchronization with an operation of the gate drive section 11. In the present embodiment, a gate on array (GOA) system formed from TFTs and the like on the display panel 10 is applied to a part of the source drive section 12. A configuration of the source drive section 12 will be described with reference to FIG. 2.

Figure 2:
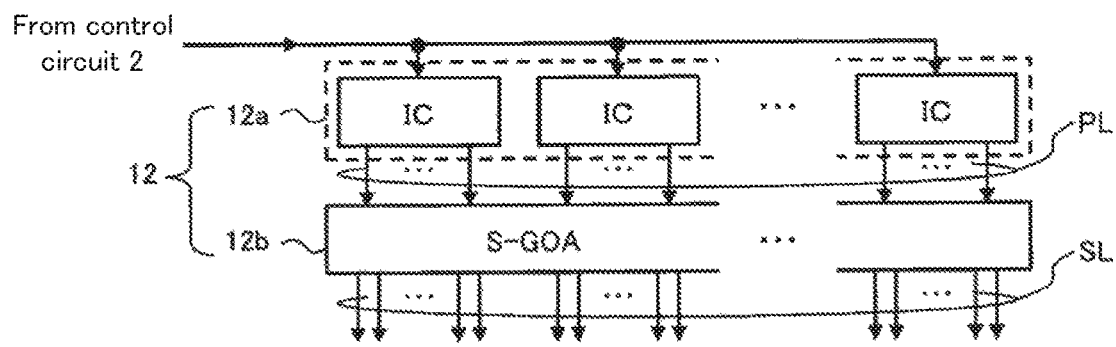
FIG. 2 illustrates a configuration of a source drive section in the display device.

FIG. 2 illustrates the configuration of the source drive section 12 in the display device 1. As illustrated in FIG. 2, the source drive section 12 includes a source drive circuit 12a and a source-GOA (S-GOA) section 12b. The S-GOA section 12b is provided in for example an upper frame area on the periphery of the display area 10a of the display panel 10.

The source drive circuit 12a includes ICs each of which includes for examples signal lines PL whose number is determined in advance, and each of which is connected to the S-GOA section 12b via its own signal lines PL. According to control by the control circuit 2, the source drive circuit 12a generates source drive signals for driving the source lines SL and individually provides the source drive signals to the signal lines PL.

The S-GOA section 12b includes TFTs and the like on the display panel 10 and is connected to the source lines SL on the display panel 10. The source-GOA section 12b operating according to for example control by the gate drive section 11 switches between the source lines SL so that each of the source lines SL is connected to a corresponding signal line PL of the source drive circuit 12a. The source-GOA section 12b enables reducing the number of the signal lines PL of the source drive circuit 12a more than the number of the source lines SL. The source-GOA section 12b will be described in detail late.

1-1. Structure of Display Panel

Figure 3:
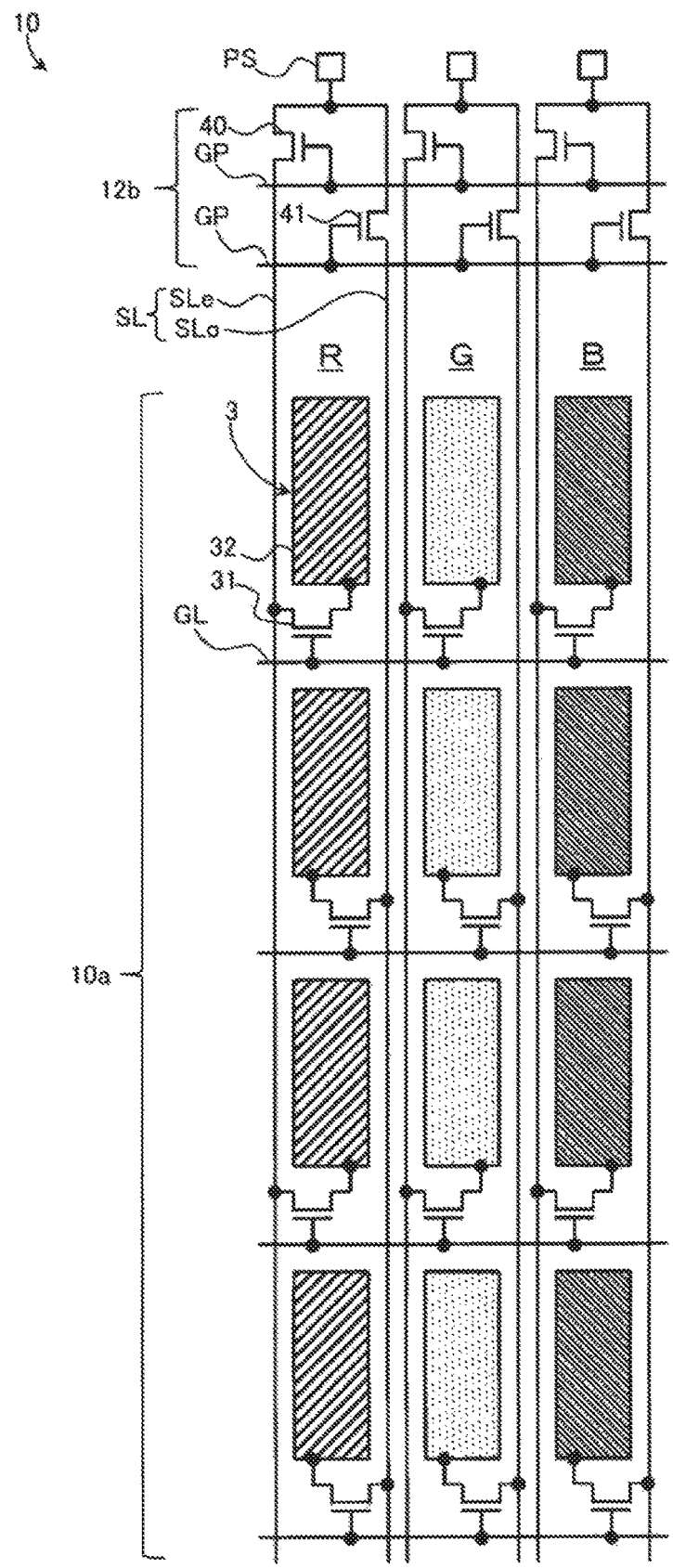
FIG. 3 is a circuit diagram of a display panel in the first embodiment and illustrates a structure thereof.

The structure of the display panel 10 in the present embodiment will be described in detail with reference to FIG. 3. FIG. 3 is a circuit diagram of the display panel 10 in the first embodiment and illustrates the structure thereof.

In the present embodiment, the display panel 10 employs a double source structure in which two source lines SL are wired to pixels 3 for each column. In the example of FIG. 3, two source lines SLe and SLo to pixels 3 for each column are wired on left and right sides of the pixels 3 in the column.

The source lines SLe and SLo on left and right sides of the pixels 3 for each column are alternately connected to respective TFTs 31 of the pixels 3. That is, adjacent pixels 3 for each pair in each column are separately connected to corresponding source lines SLe and SLo. Source lines connected to pixels 3 arranged for each row are aligned to one of the left and right sides.

In the example of FIG. 3, respective colors of the pixels 3 are set for each column. Here, each of pixels 3 in a first column represents a red (R) grayscale, each of pixels 3 in a second column represents a green (G) grayscale, and each of pixels 3 in a third column represents a blue (B) grayscale.

Each of the pixels 3 includes a TFT 31 as an active device connected to a gate line GL and a source line SL, and a pixel capacitor 32 connected to a drain of the TFT 31. The TFT 31 is turned on when a voltage of a gate signal from the gate line GL is a predetermined threshold voltage (e.g., 2 to 3V) or more, and is turned off when the voltage is less than the threshold voltage. The pixel capacitor 32 includes a liquid-crystal layer for displaying one color of predetermined colors such as RGB.

In the example of FIG. 3, input terminals PS and the S-GOA section 12b are provided above the display area 10a on the matrix of the pixels 3 in the display panel 10.

The input terminals PS are crimp terminals individually connected to the signal lines PL of the source drive circuit 12a (FIG. 2). The number of the input terminals PS (i.e., the number of the signal lines PL) corresponds to the number of the columns of the matrix of the pixels 3.

The S-GOA section 12b includes two selection lines GP and switches 40 and 41. Here, the switches 40 and 41 are provided between the source lines SL and the input terminal PS. The S-GOA section 12b of the present embodiment includes a demultiplexer for each column of the pixels 3. The demultiplexer is constituted by a switch 40 connected between a source line SLe on the left side and an input terminal PS in a corresponding column and a switch 41 connected between a source line SLe on the right side and the input terminal PS. It is accordingly possible to consolidate, for each column, source lines SLe and SLo to connect these source lines SLe and SLo to a corresponding signal line PL of the source drive circuit 12a.

Each of the switches 40 and 41 in the S-GOA section 12b includes a TFT like for example the TFTs of the pixels 3. One of the two selection lines GP is connected to respective gates of the switches 40 each of which is connected to the source line SLe on the left side in a corresponding column, while the other is connected to respective gates of the switches 41 each of which is connected to the source line SLo on the right side in the corresponding column. Each of the switches 40 and 41 in the S-GOA section may have characteristics such as lower on-resistance than on-resistance of each TFT 31 of the pixels 3. Each of the switches 40 and 41 may include a TFT that is larger in size than each TFT 31 of the pixels 3, or TFTs connected in parallel. Alternatively, PLAS may be applied to each of the switches 40 and 41.

There are difficulties in a conventional double source structure. The first difficulty is that when realizing for example 8K and 120 Hz in 55 inch-size, the crimp pitch at ICs of a source drive circuit is too narrow, thus makes mounting thereof difficult. The second difficulty is that the ICs of the source drive circuit need to be arranged on both upper and lower sides of a display panel, thereby resulting in high costs. In contrast, the display panel 10 including the S-GOA section 12*b* in the present embodiment reduces the number of ICs required for the source drive circuit 12*a*, thereby enabling solution of the difficulties described above. In this case, various characteristics such as TFT characteristics of the switches 40 and 41 may be set as appropriate.

1-2. Configuration of Control Circuit

Figure 4:
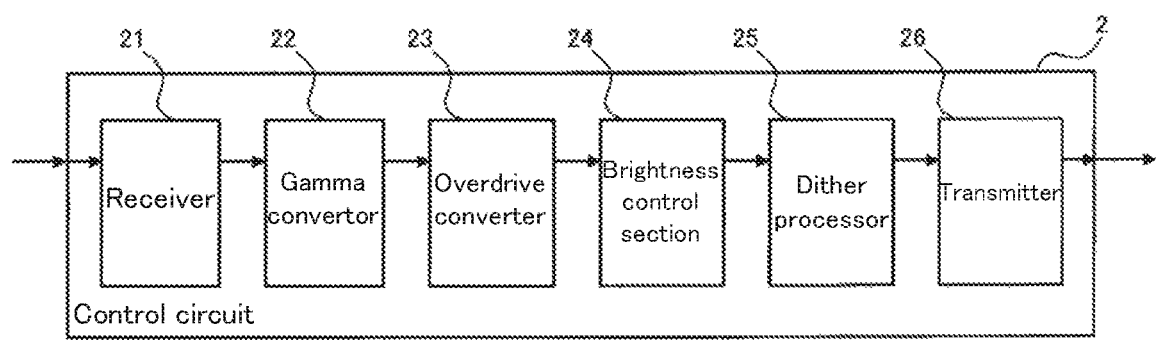
FIG. 4 is a block diagram of a control circuit in the display device and illustrates a configuration thereof.

The configuration of the control circuit 2 will be described with reference to FIG. 4. FIG. 4 is a block diagram of the control circuit 2 in the display device 1 and illustrates the configuration thereof.

As illustrated in FIG. 4, the control circuit 2 includes a receiver 21, a gamma convertor 22, an overdrive converter 23, a brightness control section 24, a dither processor 25, and a transmitter 26.

The receiver 21 includes an input interface circuit compliant with a specified communication standard. The receiver 21 receives an image signal entered from an outside. The image signal from the outside contains data indicating an image for each frame and various synchronization signals.

The gamma convertor 22 executes a gamma conversion process for applying gamma correction to the image in the received image signal.

The overdrive converter 23 applies for example an overdrive conversion process to the image after the gamma conversion process. The overdrive conversion process is a process of applying conversion to current image data while referring to past image data such as one frame before in order to perform an overshoot drive of the pixels 3 of the display panel 10.

The brightness control section 24 performs control of a grayscale for each pixel (hereinafter referred to as "brightness control") so that one of preset adjacent pixels for each pair in for example the image after the overdrive conversion process has a grayscale value greater than or equal to a grayscale value the other has with an average value between the preset adjacent pixels maintained. The brightness control by the brightness control section 24 enables an increase in a viewing angle of images displayed on the display panel 10.

The dither processor 25 performs a dither process of applying, to the image to which grayscale control is applied by the brightness control section 24, dithering according to the number of colors to be emitted from the display panel 10.

The transmitter 26 includes an output interface circuit compliant with the specified communication standard. The transmitter 26 transmits a signal indicating a resultant image by various processes described above to the source drive section 12 of the display panel 10. The transmitter 26 also outputs control signals for the source drive section 12 and the gate drive section 11, synchronization signals for synchronizing respective operation timings of components, and the like.

The control circuit 2 performs an image signal process as described above and sets a voltage corresponding to a grayscale for each pixel in the source signal. In this case, the control circuit 2 for example inverts the voltage polarity of the source signal for each frame.

The control circuit 2 may be a hardware circuit such as a dedicated electronic circuit or a reconfigurable electronic circuit designed so as to realize a predetermined function such as the brightness control section 24 described above. In addition, the control circuit 2 may include a CPU or the like that realizes various functions as described above in cooperation with software. The control circuit 2 may include various semiconductor integrated circuits such as CPU, MPU, microcomputer, DSP, FPGA, and ASIC.

2. Operation

An operation of the display device 1 configured as described above will hereinafter be described.

2-1. Problem of Brightness Control

In the display device 1 according to the present embodiment, the brightness control section 24 of the control circuit 2 performs the brightness control in order to ensure a wide viewing angle when displaying an image on the display panel 10. Here, the problem of brightness control in a conventional display panel will be described with reference to FIGS. 5 and 6.

FIG. 5 illustrates the problem of brightness control in the display panel. FIG. 6 is a timing diagram depicting an operation example of a display panel that solves the problem of brightness control.

In the present embodiment, the brightness control section 24 performs the brightness control by controlling a grayscale for each pixel in an image signal so that one of preset pixels for each pair is brightened, while the other is darkened. For example, when receiving an image signal containing an image in which every grayscale is constant, the brightness control section 24 outputs an image in which two grayscales for each pair with an average value matching a corresponding original grayscale are arranged in a predetermined pattern such as a staggered lattice. When such brightness control is applied to the conventional display panel, it is assumed that for example when each grayscale of an input image is constant as described above, a user visually recognizes the image as if image quality thereof has deteriorated.

Figure 5A:
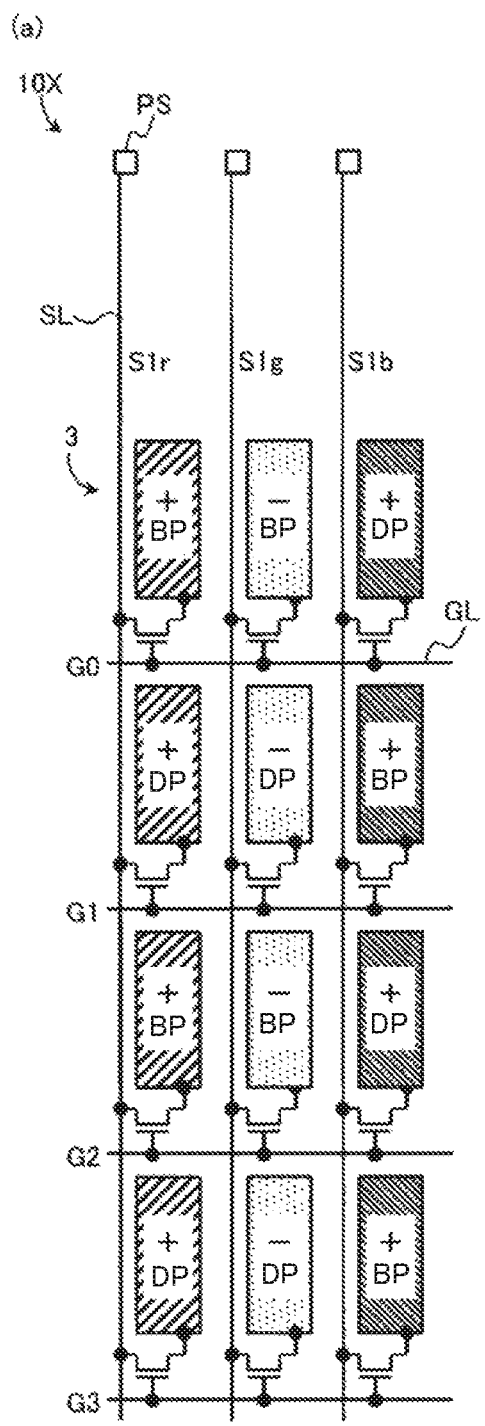
FIGS. 5A and 5B illustrate a problem of brightness control in the display panel.
Figure 6:
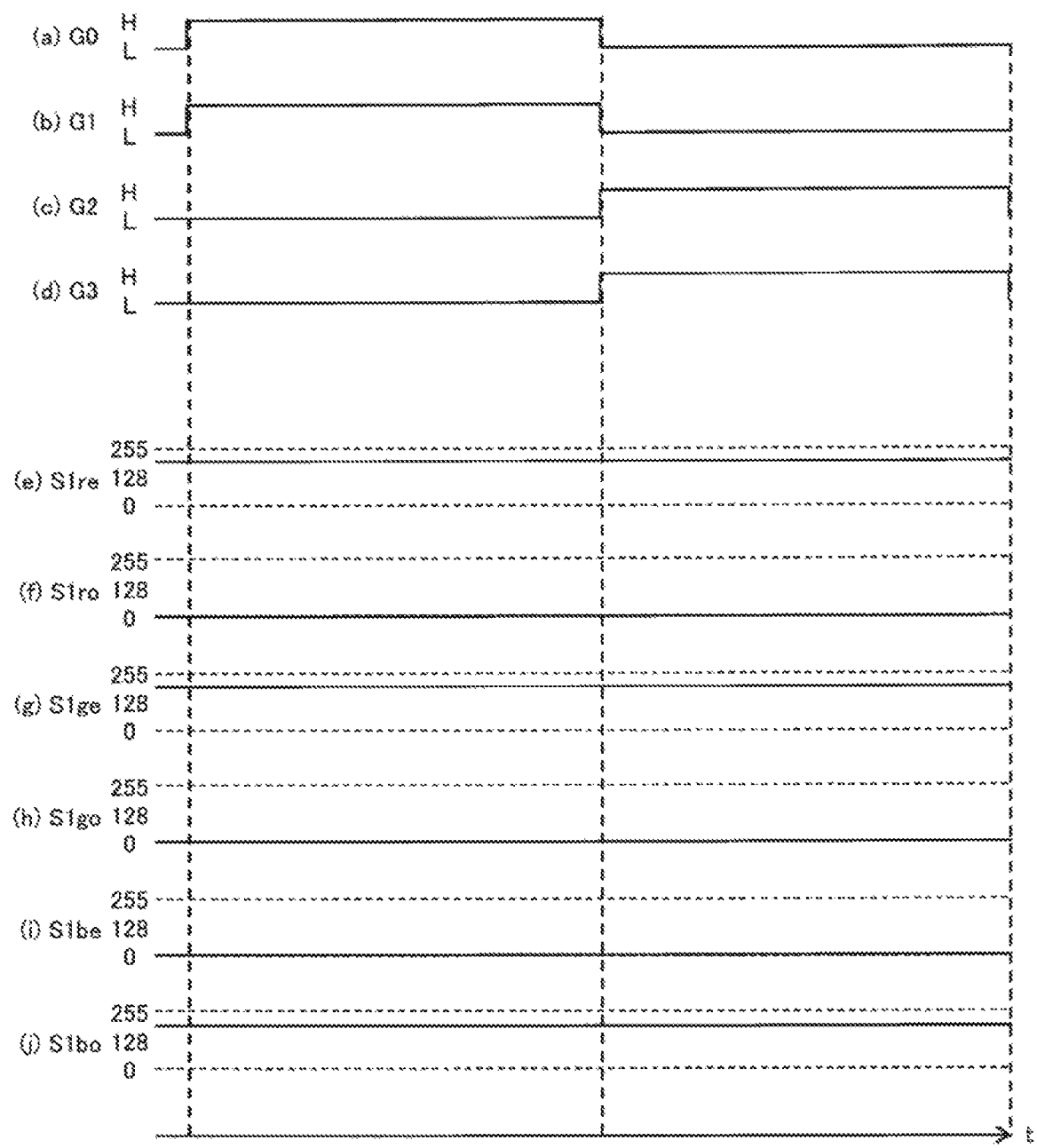
FIG. 6 is a timing diagram depicting an operation example by the brightness control.

FIG. 5A illustrates a display panel 10X with a conventional single source structure. As illustrated in FIG. 5A, in the single source structure, one source line SL is wired along pixels 3 for each column. In the example of FIG. 5A, pixels to be brightened ("BP" in the figure) and pixels to be darkened ("DP") by the brightness control are arranged alternately in a direction of pixels 3 for each column. Each of source signals S1*r*, S1*g*, and S1*b* has the same voltage polarity for each column so that the source signals S r, S g, and S1*b* are alternately arranged in the row direction.

For example, when the display panel 10X having the conventional configuration as described above displays an image after the brightness control to the input image in which each grayscale is constant, pixels to be brightened and pixels to be darkened more than original grayscales are to be arranged alternately. For this reason, a source signal S1*r*, S1*g*, or S1*b* on each source line SL has a signal waveform in which in one frame, a voltage of the same voltage polarity vibrates according to brightness for each pixel. It is conceivable that pixels 3 with insufficient charge occur in the display panel 10X because such a signal waveform becomes dull as it propagates through the source line SL. Thus, it is assumed that in the conventional configuration, display unevenness or the like is visually recognized in the display image on the display panel 10X.

Figure 5B:
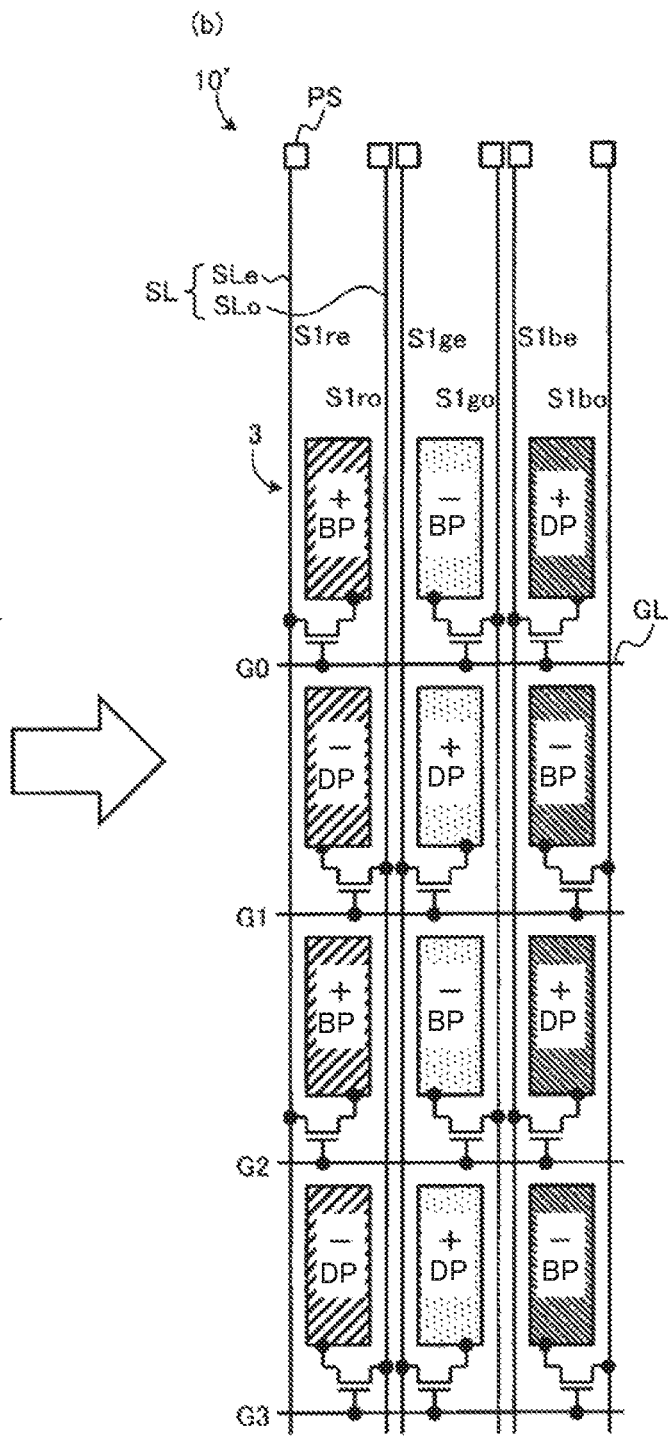

Therefore, the display device 1 according to the present embodiment employs a double source structure for the display panel. FIG. 5B depicts a configuration example of the display panel with the double source structure.

A display panel 10' in the configuration example of FIG. 5B includes pixels 3 whose pixels 3 for each column are alternately connected to source lines SLe and SLo on both sides thereof like the configuration depicted in FIG. 3. Respective source lines connected to pixels 3 arranged for each row are alternately arranged on the left and right sides. The arrangement of the brightness control for each pixel 3 is the same as the example depicted in FIG. 5A. In addition, respective voltage polarities (±) of source signals S1*re*, S1*ro*, S1*ge*, S1*go*, S1*be*, and S1*bo* are set in a staggered pattern for each of the pixels 3. The display panel 10' as described above may be included in a display device 1 configured like the display device 1 depicted in FIG. 1.

Items (a) to (j) of FIG. 6 illustrate an operation example of the display device 1, including the display panel 10' configured as depicted in FIG. 5B, for example when receiving an input image in which each grayscale is constant.

The items (a), (b), (c), and (d) of FIG. 6 depict respective operation timings according to gate signals G0, G1, G2, and G3 in first to fourth rows. The items (e) and (f) of FIG. 6 depict respective supply timings of source signals S1*re* and S1*ro* to source lines SLe and SLo on both sides of pixels 3 in a first column. The items (g) and (h) of FIG. 6 depict respective operation timings according to source signals S1*ge* and S1*go* on both sides of pixels 3 in a second column, while the items (i) and (j) of FIG. 6 depict respective operation timings according to source signals S1*be* and S1*bo* on both sides of pixels 3 in a third column. In the items (a) to (d) of FIG. 6, "H" represents a HIGH level voltage larger than a threshold voltage of the TFT 31 of a corresponding pixel 3, and "L" represents a LOW level voltage less than the threshold voltage of the TFT 31 (same applies hereafter).

In the case of the operation example depicted in the items (a) to (j) of FIG. 6, the pixels 3 in the first row and the pixels 3 in the second row are first selected at the same time ((a) and (b) of FIG. 6), and pixels 3 in the third row and the pixels 3 in the fourth row are then selected at the same time ((c) and (d) of FIG. 6). The brightness control section 24 performs the brightness control as depicted in the item (b) of FIG. 5. For example, the brightness control section 24 performs control so that for example in the first column, each grayscale of the pixels in the first and third rows is brightened, while each grayscale of the pixels in the second and fourth rows is darkened.

In this case, the source signals S1*re* and S1*ro* with different voltages are supplied to the source lines SLe and SLo on both the sides of the pixels 3 in the first column ((e) and (f) of FIG. 6). The voltage of the source signal S1*re* and the voltage of the source signals S1*ro* correspond to a bright grayscale and a dark grayscale, respectively, and each of the voltages is supplied as a constant voltage as depicted in the items (e) and (f) of FIG. 6. Similarly, each of the source signals S1*ge* to S1*bo* to the source lines SLe and SLo in other columns is supplied at a constant voltage ((g) to (j) of FIG. 6).

As described above, the brightness control is performed in the display panel 10' having the double source structure in the case of the input image in which each grayscale is constant, thereby maintaining the source signals S1*re* to S1*bo* at a constant voltage. It is consequently possible to avoid insufficient charge of each pixel 3. This enables displaying a display image in an easy-to-see manner with display unevenness not visually recognized while ensuring a viewing angle.

Here, the display panel 10' with the configuration depicted in FIG. 5B includes input terminals PS whose number is twice the number of those of the single source structure depicted in FIG. 5A, and a source drive circuit 12*a* thereof requires ICs twice as many as those of the single source structure. The present embodiment therefore uses the display panel 10 with the S-GOA section 12*b*, thereby providing the display device 1 that displays an image in an easy-to-see manner like the configuration example depicted in FIG. 5B with the number of ICs maintained at the number of ICs in the configuration depicted in FIG. 5A. An operation of the display device 1 according to the present embodiment will hereinafter be described in detail.

2-2. Details of Operation

Figure 7:
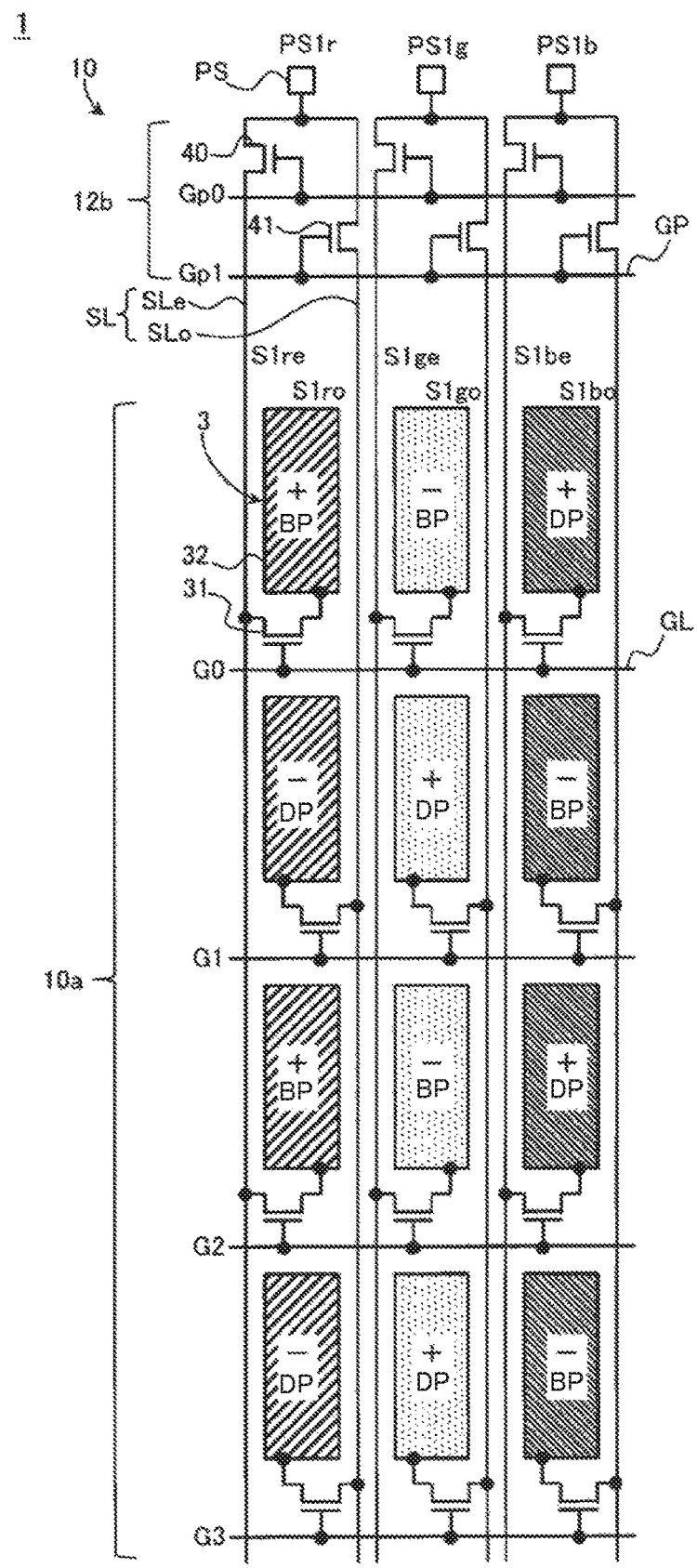
FIG. 7 illustrates an operation of the display device according to the first embodiment.
Figure 8:
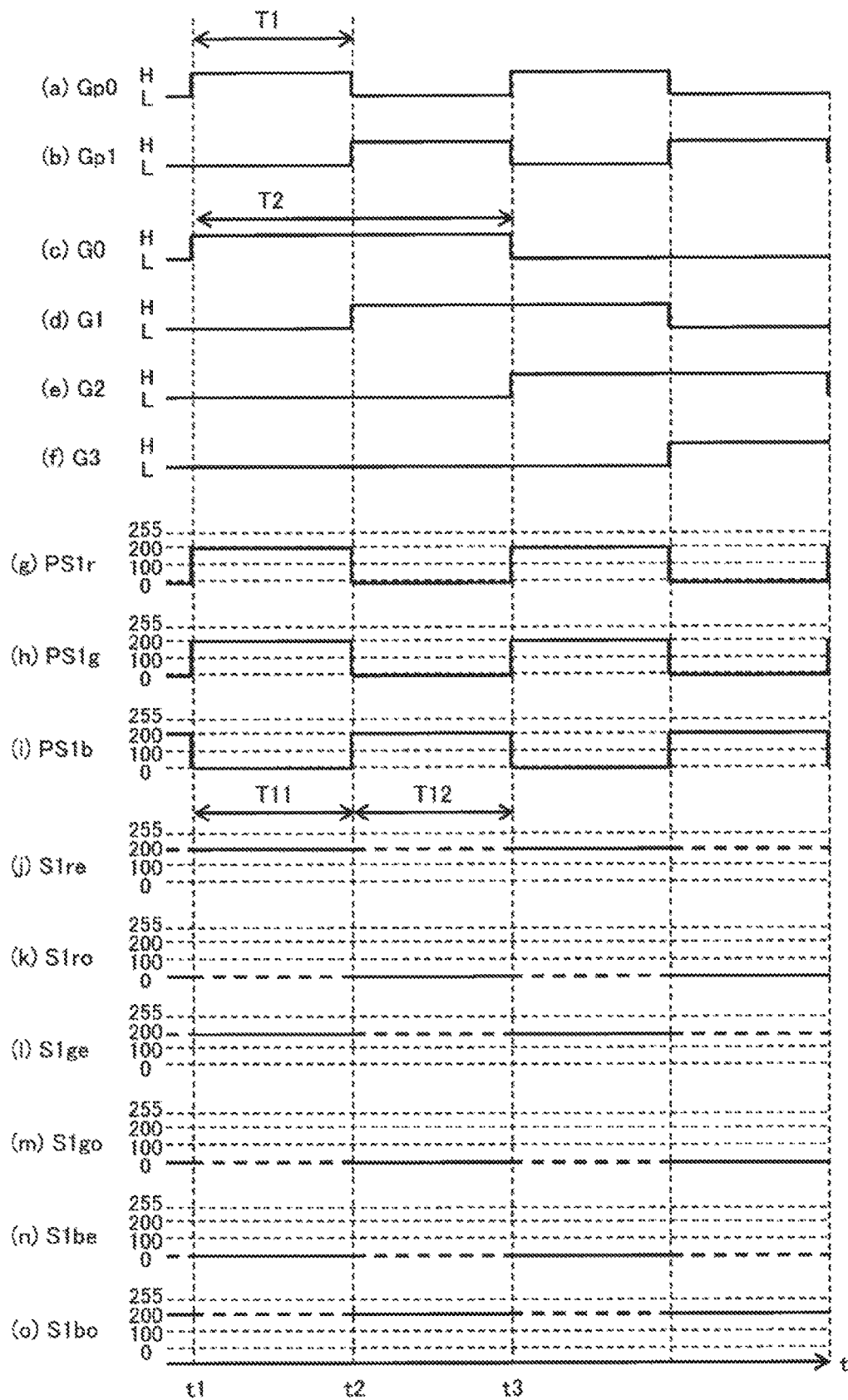
FIG. 8 is a timing diagram depicting an operation example of the display device according to the first embodiment.

The operation of the display device 1 according to the first embodiment will be described with reference to FIGS. 7 and 8. FIG. 7 illustrates the operation of the display device 1 according to the present embodiment. FIG. 8 is a timing diagram depicting an operation example of the display device 1.

FIG. 7 depicts an arrangement example of bright pixels 3 ("BP" in the figure) whose grayscale values are increased and dark pixels 3 ("DP") whose grayscale values are decreased in the brightness control of the display panel 10 (FIG. 10). In the present embodiment, bright pixels 3 and dark pixels 3 are arranged alternately for each column in the display panel 10 like the configuration example depicted in FIG. 5B. For example, bright pixels 3 and dark pixels 3 are also arranged two each in the row direction. Note that respective voltage polarities (±) of source signals S1*re*, S1*ro*, S1*ge*, S1*go*, S1*be*, and S1*bo* are set in a staggered pattern in the matrix of the pixels 3.

The brightness control section 24 (FIG. 4) sets each grayscale based on a grayscale for each pixel in the input image so that a grayscale value (called a "bright grayscale") for each bright pixel 3 is greater than or equal to a grayscale value (called a "dark grayscale") for each dark pixel 3. In this case, the brightness control section 24 controls for example a bright grayscale and a dark grayscale between adjacent pixels for each pair whose average value maintains a corresponding grayscale value of the input image.

Hereinafter, an operation example in the case of the brightness control of an input image whose entire image has a grayscale value "100" will be described. It is assumed that for the input image of the grayscale value "100", each bright grayscale is assigned a grayscale value "200", while each dark grayscale is assigned a grayscale value "0". Items (a) to (o) of FIG. 8 represent various operation timings in the present example.

The items (a) and (b) of FIG. 8 represent respective control timings of control signals Gp0 and Gp1 to the switches 40 and 41 in the S-GOA section 12*b*. The items (c), (d), (e), and (f) of FIG. 8 illustrate respective operation timings according to gate signals G0, G1, G2, and G3 in first to fourth rows. The items (g), (h), and (i) of FIG. 8 represent respective output timings according to source drive signals PS1*r*, PS1*g*, and PS1*b* in first to third columns. The items (j) and (k), (l) and (m), and (n) and (o) of FIG. 8 represent respective supply timings according to source signals S1*re* and S1*ro*, S1*ge* and S1*go*, and S1*be* and S1*bo* on both sides for each of the first to third columns.

In the display device 1, as depicted in the items (a) and (b) of FIG. 8, the gate drive section 11 (FIG. 1) generates the control signals Gp0 and Gp1 and alternately turns the switches 40 and the switches 41 of the S-GOA section 12b on and off at regular intervals of a horizontal synchronization period T1 (FIG. 7). The horizontal synchronization period T1 is a period of time (e.g., 3.7 microseconds) representing a cycle for outputting the source signals PS1r to PS1b in synchronization with the pixels 3 in the first row. The left source line SLe and the right source line SLo for each column are alternately connected to a corresponding input terminal PS according to switching control of the switches 40 and 41 by the control signals Gp0 and Gp1.

The gate drive section 11 generates gate signals G0 to G3 which sequentially rises for each horizontal synchronization period T1 ((c) to (f) of FIG. 8), thereby selecting a gate line GL of each row in order from the first row. In the present embodiment, each of the gate signals G0 to G3 has a pulse width T2 that is twice the horizontal synchronization period T1. The gate line GL for each row is controlled so that during a period of a corresponding pulse width T2, respective TFTs 31 of pixels 3 in a corresponding row are turned on.

The source drive section 12 (FIG. 2) causes the source drive circuit 12a to generate a source drive signal PS1r, PS1g, or PS1b for each column ((g) to (i) of FIG. 8) so that grayscale values for each row are represented by time division. The source drive signals PS1r to PS1b are individually entered to the input terminals PS provided for the S-GOA section 12b of the display panel 10 (FIG. 7).

In the example of the items (g) to (i) of FIG. 8, each of the source drive signals PS1r, PS1g, and PS1b in the first to third columns has a signal waveform alternately containing a voltage corresponding a grayscale value "200" (bright grayscale) and a voltage corresponding to a grayscale value "0" (dark grayscale) for each horizontal synchronization period T1. For example, the source drive signal PS1r in the first column represents the bright grayscale "200" during the horizontal synchronization period T1 from time t1 to time t2 and the dark grayscale "0" during the horizontal synchronization period T1 from the time t2 to time t3, and alternately repeats the grayscales described above after the time t3.

Note that although each vertical axis of the items (g) to (i) of FIG. 8 represents a grayscale value, a voltage polarity "+" or "−" is used for a voltage representing each of various grayscales (same applies hereafter). For example, each of the source drive signals PS1r and PS1b in the first and third columns has a voltage polarity "+" when representing the bright grayscale "200", while the source drive signal PS1g in the second column has a voltage polarity "−" when representing the same grayscale (see FIG. 7). For example, the voltage polarity of a source drive signal PS1r, PS1g, or PS1b for each column is set every horizontal synchronization period T1 and inverted every frame.

The source drive signal PS1r ((g) of FIG. 8) in the first column is supplied as the source signal S1re to the source line SLe on the left side via one of the switches 40 from the input terminal PS in the first column during a source drive period T11 from the time t1 to the time t2 ((a) and (j) of FIG. 8). In this case, the gate line GL in the first column is selected by the gate signal G0 ((c) of FIG. 8), and the voltage of the bright grayscale "200" is applied as the source line SLe to the source line SLe on the left side of a pixel 3 in the first row and the first column, thereby charging the pixel 3.

The source drive signal PS1r ((g) of FIG. 8) is then supplied as the source signal S1ro to the source line SLo on the right side via a different switch 41 from the input terminal PS during a period T12 from the time t2 to the time t3 ((b) and (k) of FIG. 8). During the period T12, the voltage from the input terminal PS is not applied to the source line SLe on the left side that is therefore in a floating state (hereinafter referred to as a "floating period").

Similarly, after the time t3, the source drive period T11 during which the voltage of the bright grayscale "200" is applied to the source line SLe on the left side, and the floating period T12 are repeated ((j) of FIG. 8). This make it possible to prevent the signal waveform of the source signal S1re from dulling as compare with a voltage of the dark grayscale "0" or the like being applied to the source signal S1re.

In the present embodiment, the drive of the gate line GL in the first row is continued by the gate signal G0 with a pulse width T2 during the floating period T12 described above ((c) of FIG. 8). It is considered that during the source drive period T11 before the floating period T12, the voltage of the bright grayscale "200" applied to the source line SLe on the left side charges parasitic capacitance of the source line SLe. This enables extension of a charging period of the pixel 3 in the first row during the floating period T12 by using the voltage charged to the parasitic capacitance for charge of the pixel 3.

The source signal S1ro supplied to the source line SLo on the right side is entered as the dark grayscale "0" to a pixel 3 in the second row and the first column from the time t2. Similarly, pixels 3 in the third and subsequent rows are sequentially charged by the bright grayscale "200" and the dark grayscale "0" contained in the source signals S1re and S1ro derived from the source drive signal PS1r ((g), (j), and (k) of FIG. 8).

Like the operation described above, pixels 3 in other columns are charged by respective grayscales contained in the source signals S1ge, S1go, S1be, and S1bo derived from the source drive signals PS1g and PS1b in the respective columns ((h), (i), and (l) to (o) of FIG. 8).

In the case of the operation described above, when an image in which each grayscale is constant is displayed, each of the source signals PS1r to PS1b from the source drive circuit 12a has a vibrating signal waveform, whereas each of the source signals S1re to S1bo to the source lines SL on the display panel 10 has a signal waveform that does not vibrate in particular, thereby suppressing the dulling. This enables displaying an image to the user in an easy-to-see manner like the configuration example depicted in FIG. 5B in the circuit scale of the source drive circuit 12a equivalent to the single source structure (FIG. 5A).

3. Brief Outline

The display device 1 according to the present embodiment includes the pixels 3, the source lines SL, the source drive circuit 12a, and the switches 41 and 42. The pixels 3 are arranged in a matrix and form the display area 10a for displaying an image. The source lines SL are wired in the column direction (y) of the matrix of the pixels 3 on the display area 10a and connected to the pixels 3. The source drive circuit 12a includes the signal lines PL that allow the source drive signals PS1r to PS1b to be supplied therefrom to the pixels 3 via the source lines SL. The switches 41 and 42 are provided between the source lines SL and the signal lines PL. Of the source lines SL, prescribed source lines SL are wired to pixels 3 in an identical column of the matrix. The prescribed source lines SLe and SLo to the pixels 3 in the identical column are connected to one corresponding signal line PL of the source drive circuit 12a via corresponding switches 40 and 41.

The display device 1 described above consolidates the prescribed source lines SLe and SLo to the pixels 3 in the identical column to connect them to the one corresponding signal line PL of the source drive circuit 12a, thereby enabling a reduction in the circuit scale of the source drive circuit 12a.

In the present embodiment, the switches 40 and 41 are provided as the S-GOA section 12b in a frame area on the periphery of the display area 10a. The display panel 10 including the S-GOA section 12b enables a reduction in the number of external ICs.

The present embodiment includes, as the prescribed source lines SL, two source lines SLe and SLo wired to the pixels 3 in the identical column. This double source structure enables a large display panel 10 to display a high definition image at a high drive frequency in an easy-to-see manner.

The display device 1 according to the present embodiment further includes the control circuit 2 that controls the image to be displayed on the display area 10a. The prescribed source lines SLe and SLo connected to the pixels in the identical column are individually connected to adjacent pixels 3 for each pair in the identical column. The control circuit 2 controls a grayscale for each of the pixels 3 in the image so that one of the adjacent pixels 3 for each pair in the column direction has a grayscale value greater than or equal to a grayscale the other has. This brightness control enables the display panel 10 to display an image with a wide viewing angle in an easy-to-see manner.

The display device 1 according to the present embodiment further includes the gate drive section 11. The gate drive section 11 selects between the gate lines GL so that each of the gate lines GL is sequentially selected at predetermined regular intervals T1, and drives the selected gate line GL. Here, the gate lines GL are wired in the row direction of the matrix of the pixels 3 and connected to the pixels 3. The switches 40 and 41 switches between the sources lines SL so that each of the source lines SL is connected to a corresponding signal line PL of the source drive circuit 12a at the regular intervals T1. Thus, the switches 40 and 41 synchronize with the drive by the gate drive section 11, thereby functioning as a demultiplexer.

In the present embodiment, the source drive circuit 12a provides the source drive signals PS1r to PS1b to pixels 3 connected to the gate line GL selected by the gate drive section 11 at the regular intervals T1. The gate drive section 11 drives the selected gate line GL during a predetermined regular interval T2 longer than the regular interval T1. This enables extension of a charging period of the pixels 3 connected to the driven gate line GL by flattening a voltage distribution in the source line SL in the floating state by the parasitic capacitance during a period T12 in which a corresponding source drive signal PS1r, PS1g, or PS1b is not outputted.

In the present embodiment, the display device 1 includes the pixels 3, the source lines SL, and the control circuit 2. Of the source lines SL, prescribed source lines SL are wired to pixels 3 in an identical column of the matrix. Adjacent pixels 3 for each pair in the identical column are separately connected to source lines SLe and SLo to the pixels 3 in the identical column (see FIG. 5B). The control circuit 2 controls a grayscale for each of the pixels 3 in the image so that one of the adjacent pixels 3 for each pair has a grayscale value greater than or equal to a grayscale the other has (FIGS. 6 and 8).

The display device 1 described above enables a display panel 10 or 10' with the double source structure to display an image in an easy-to-see manner without degrading image quality thereof even when displaying the image with each grayscale being constant by performing the brightness control among the pixels 3 connected to the source lines SLe and SLo for each column.

Second Embodiment

A display device according the second embodiment will be described. Here, the display device further includes auxiliary capacitors that contribute to flattening of a voltage distribution in source lines SL.

Figure 9:
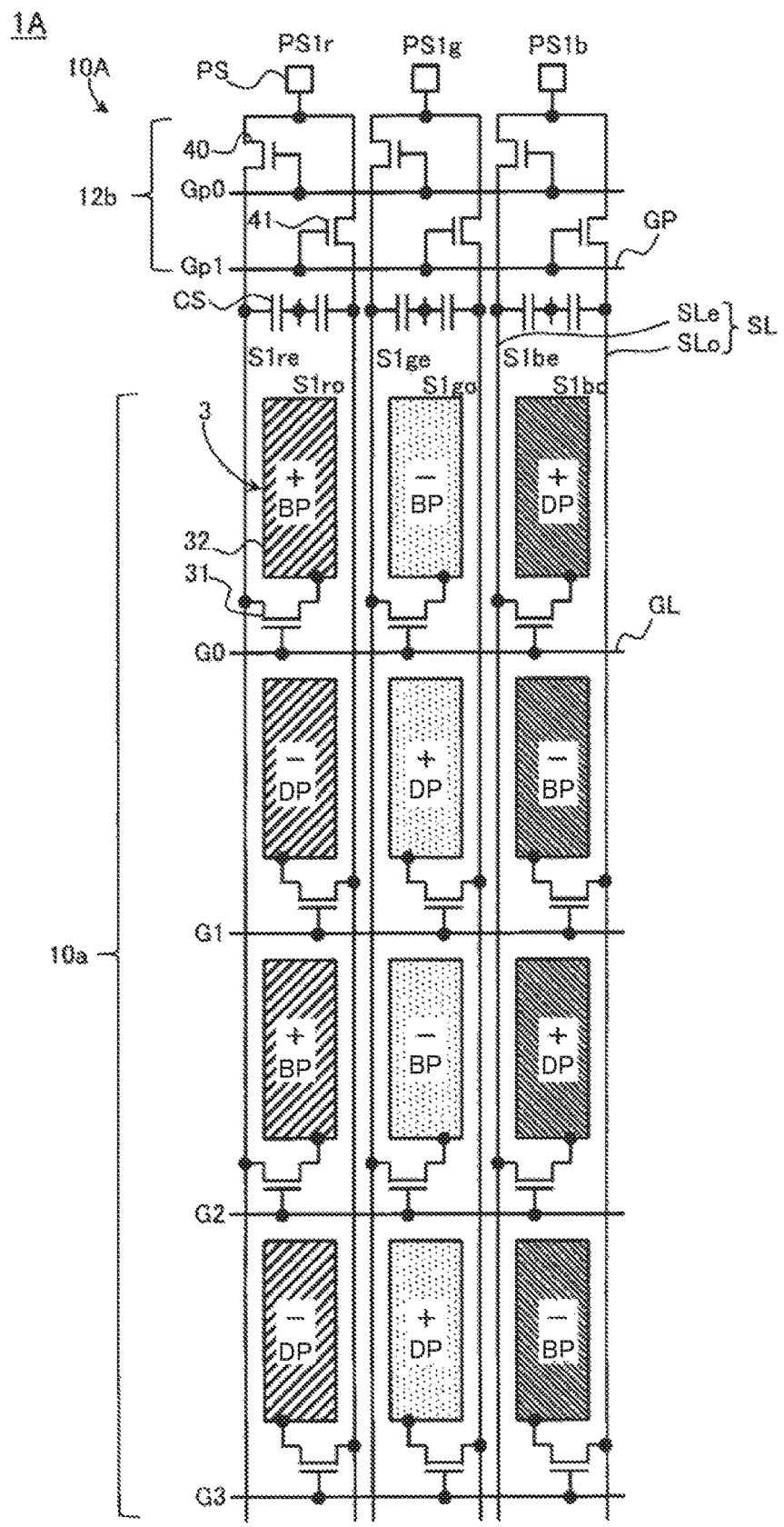
FIG. 9 is a circuit diagram of a display panel in a display device according to a second embodiment.

FIG. 9 is a circuit diagram of a display panel 10A of the display device 1A according to the second embodiment. As illustrated in FIG. 9, the display panel 10A of the display device 1A according to the present embodiment further includes auxiliary capacitors CS in addition to a configuration similar to that of the display panel 10 (FIG. 3) in the first embodiment. The auxiliary capacitors CS are capacitance elements individually provided for the source lines SL in the display panel 10A. For example, the auxiliary capacitors CS are individually provided adjacent to respective drains of switches 40 and 41 of a S-GOA section 12b.

Figure 10A:
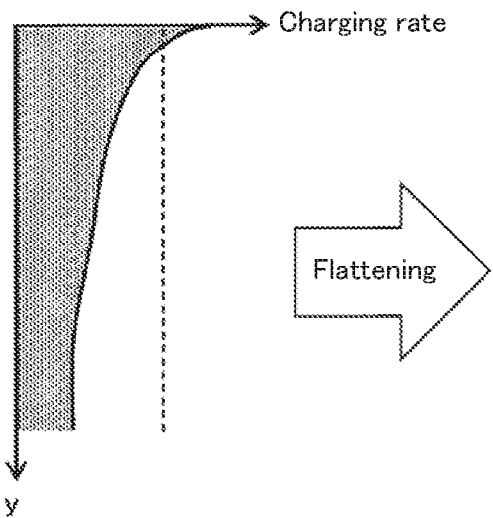
FIGS. 10A to 10D illustrate action of auxiliary capacitors in the display panel.
Figure 10B:
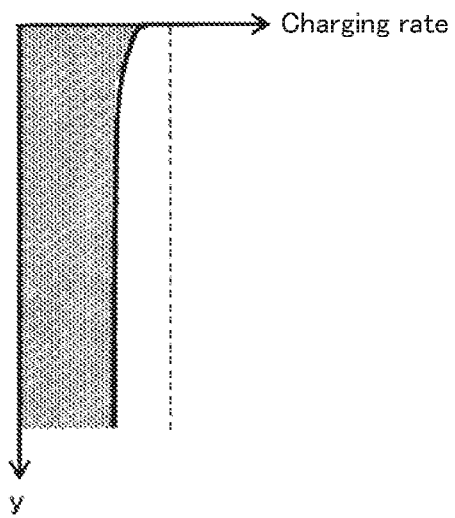
Figure 10C:
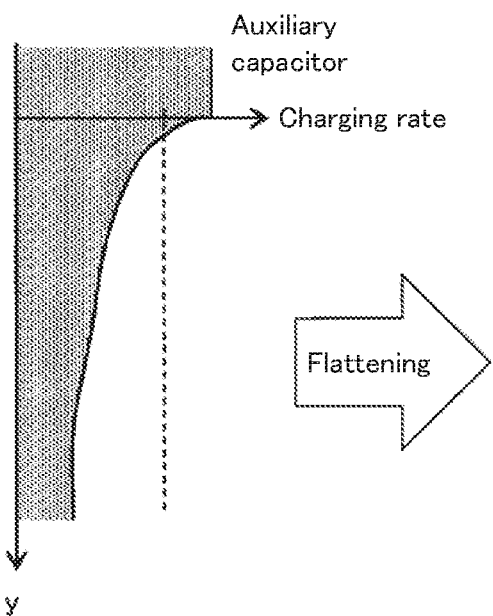
Figure 10D:
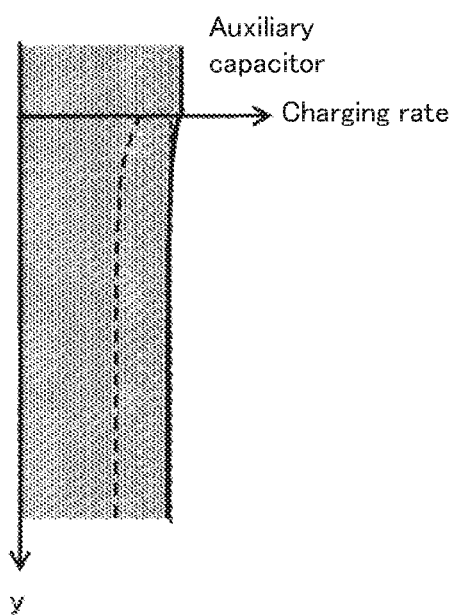

FIGS. 10A to 10D illustrate action of the auxiliary capacitors CS in the display panel 10A. FIGS. 10A and 10B illustrate a charging rate distribution in a column direction (y) of the display panel 10 with no auxiliary capacitors CS (first embodiment). FIGS. 10C and 10D illustrate a charging rate distribution in a column direction (y) of the display panel 10A with the auxiliary capacitors CS.

FIG. 10A illustrates the charging rate distribution while pixels 3 aligned in the column direction (y) in the display panel 10 are being charged by corresponding source signals with a voltage representing a specific grayscale during a source drive period T11. FIG. 10B illustrates the charging rate distribution after a lapse of the floating period T12 from the state depicted in FIG. 10A.

It is considered that the charging rate of the pixels 3 on a lower side (+y side) in the display panel 10 is lower as illustrated in FIG. 10A because respective positions of the pixels 3 are farther from the input terminals PS of the source drive signals derived from the source drive circuit 12a. In contrast, as illustrated in FIG. 10B, the floating period T12 is provided and a voltage distribution is flattened with an entire charge on the source lines SL held, thereby enabling improvement of respective charging rates of the pixels 3 on the lower side.

The flattening of the voltage distribution as described above is possible by using parasitic capacitance of each source line SL. It is however assumed that a flat voltage distribution is not reached during the floating period T12 because each source line SL includes a parasitic resistance, thereby increasing a time constant. The present embodiment therefore promotes the flattening of the voltage distribution by using the auxiliary capacitors CS.

FIG. 10C illustrates a charging rate distribution of pixels 3, in the display panel 10A including the auxiliary capacitors CS, which are being charged during a source drive period T11 like the configuration depicted in FIG. 10A. FIG. 10D illustrates a charging rate distribution after a lapse of a floating period T12 from the state depicted in FIG. 10C.

As illustrated in FIG. 10C, the display panel 10A in the present embodiment charges the auxiliary capacitors CS by respective corresponding source signals during a source drive period T11 like the operation depicted in FIG. 10A. As illustrated in FIG. 10D, this enables improvement of respective charging rates of the pixels 3 by promoting the flattening of the voltage distribution by respective voltages charged to the auxiliary capacitors CS during the floating period T12 like the operation depicted in FIG. 10B. Respective capacitance values of the auxiliary capacitors CS may be appropriately set in consideration of a time constant of an entire source line SL, length of the floating period T12, and the like.

As described above, the display device 1A according to the present embodiment includes the auxiliary capacitors CS individually connected to the source lines SL. The auxiliary capacitors CS are used to promote the flattening of the voltage distribution in floating source lines SL that are not connected to respective corresponding signal lines PL. The auxiliary capacitors CS promote the flattening of the voltage distribution in the source lines SL, thereby enabling improvement of the charging rate dispersion of the pixels 3.

Third Embodiment

A display device according to a third embodiment will be described. Here, the display device includes an S-GOA section 12b in which the number of switches provided for each source line SL is increased in order to reduce a usage rate of each switch.

Figure 11:
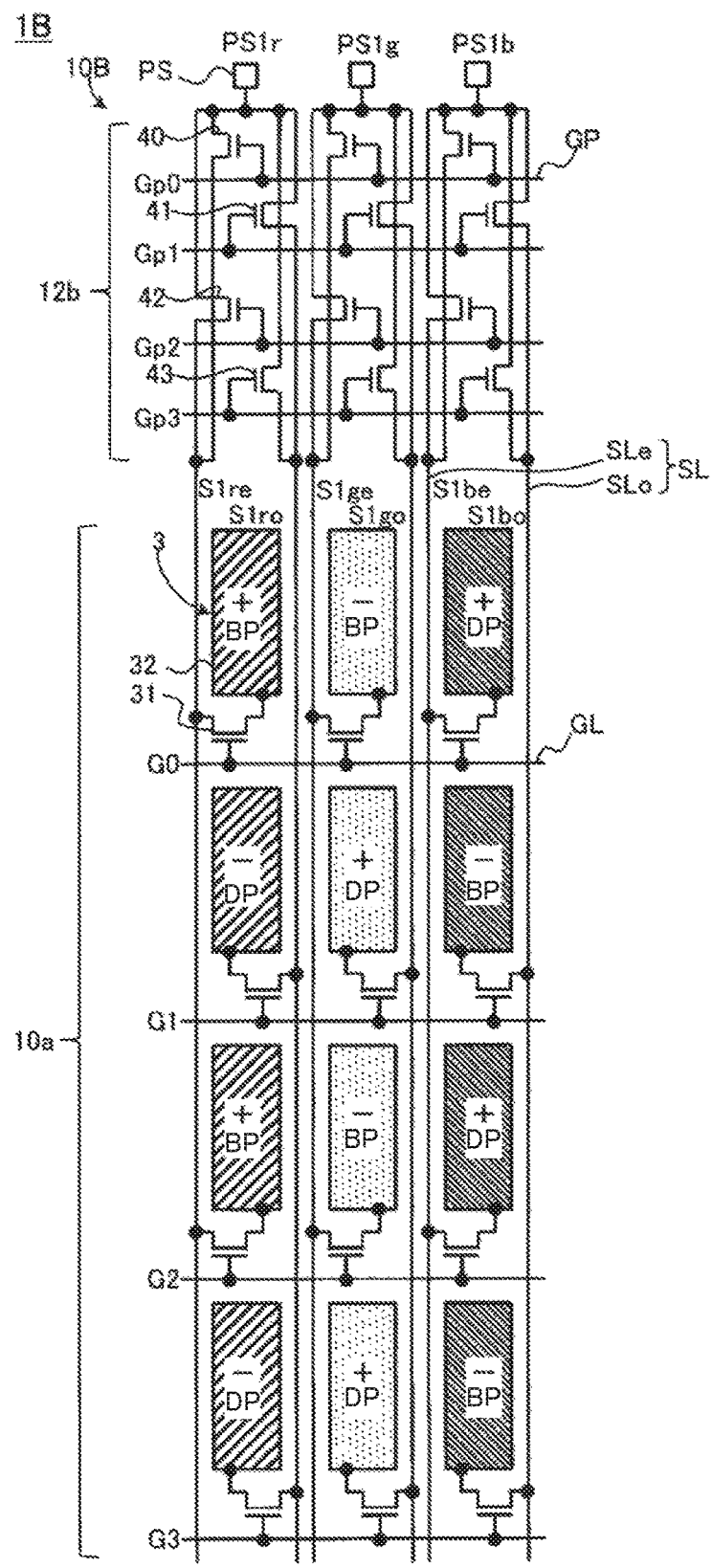
FIG. 11 is a circuit diagram of a display panel in a display device according to a third embodiment.

FIG. 11 is a circuit diagram of a display panel 10B of a display device 1B according to the third embodiment. The display panel 10B of the display device 1B according to the present embodiment includes switches 40 to 43. Here, one source line for each column is provided with switches 40 and 42, while the other is provided with switches 41 and 43 as illustrated in FIG. 11 in a configuration similar to that of the display panel 10 (FIG. 3) in the first embodiment.

In the example of FIG. 11, two switches 40 and 42 are provided for each column in parallel between a source line SLe on a left side and an input terminal PS. Respective gates of the switches 40 and 42 are separately connected to corresponding selection lines GP. Similarly, two switches 41 and 43 are provided in parallel for a source line SLe on a right side for each column and include respective gates that are separately connected to corresponding selection lines GP.

In the present embodiment, the four control signals Gp0 to Gp3 for turning on and off the four switches 40 to 43 provided for pixels 3 for each column are supplied to respective selection lines GP. An operation of the display device 1B according to the present embodiment will be described with reference to items (a) to (q) of FIG. 12.

Figure 12:
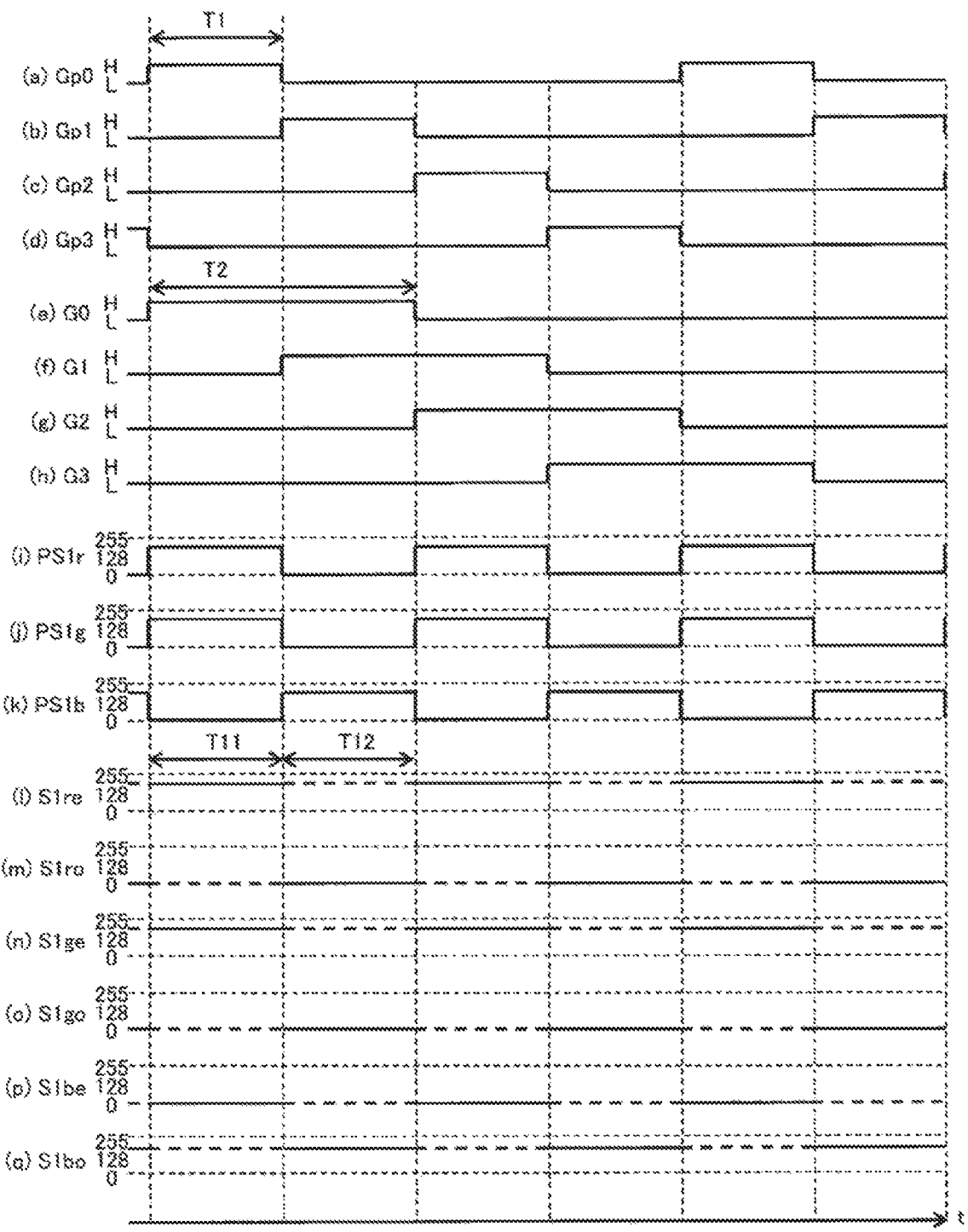
FIG. 12 is a timing diagram depicting an operation example of the display device according to the third embodiment.

The items (a) to (d) of FIG. 12 illustrate respective control timings of the four switches 40 to 43 provided for pixels for each column. The items (e) to (h) of FIG. 12 illustrate respective operation timings of gate signals G0 to G3 in first to fourth rows. The items (i) to (k) of FIG. 12 illustrate respective output timings of source drive signals PS1r to PS1b in first to third columns. The items (l) to (q) of FIG. 12 illustrate respective supply timings of source signals S1re and S1ro, S1ge and S1go, and S1be and S1bo on both sides in the first to third columns.

The four control signals Gp0 to Gp3 are generated for example as illustrated in the items (a) to (d) of FIG. 12 and sequentially turn on switches 40, 41, 42, and 43 in each column every horizontal synchronization period T1. Thus, the present embodiment alternately connects two source lines SLe and SLo for each column to a corresponding input terminal PS like the operation of the first embodiment.

The operation as described above enables reducing ½ duty ratio by the control signals Gp0 and Gp1 in the first embodiment (see FIG. 8) to ¼ duty ratio by the control signals Gp0 to Gp3 of the switches 40 to 43 in the present embodiment. The duty ratio for the switches 40 to 43 in the S-GOA section 12b is close to the duty ratio for TFTs 31 of the pixels 3. It is accordingly possible to bring former characteristics change with time closer to the latter characteristics change with time. Note that the number of switches 40 to 43 for each column in the S-GOA section 12b is not limited to 4. The number being increased more than for example 4 enables rendering the duty ratio therefor smaller than ¼.

Although the switches 40 to 43 are sequentially turned on at regular intervals of the horizontal synchronization period 1H in the operation example illustrated in the items (a) to (q) of FIG. 12, the control for the switches 40 to 43 is not limited to this. For example, the control may switch between switch sets used for each frame. Here, the four switches 40 to 43 are divided into a set of switches 40 and 41 and a set of switches 42 and 43. For example, the switches 40 and 41 are sequentially turned on at regular intervals of the horizontal synchronization period 1H in the case of odd frames, while the switches 42 and 43 are sequentially turned on at regular intervals of the horizontal synchronization period 1H in the case of even frames.

As described above, the display device 1B according to the present embodiment includes the S-GOA section 12b with switches 40 to 43. Here, each source line SL is provided with a switch 40 and a switch 42, or a switch 41 and a switch 43. This configuration enables a reduction in a duty ratio of the switches 40 to 43 in the S-GOA section 12b, thereby reducing effects of aged deterioration.

Fourth Embodiment

In the first embodiment, the source lines SLe and SLo to pixels 3 for each column are consolidated in the S-GOA section 12b. A display device according to a fourth embodiment will be described. Here, source lines SL for each specific set of columns are consolidated.

Figure 13:
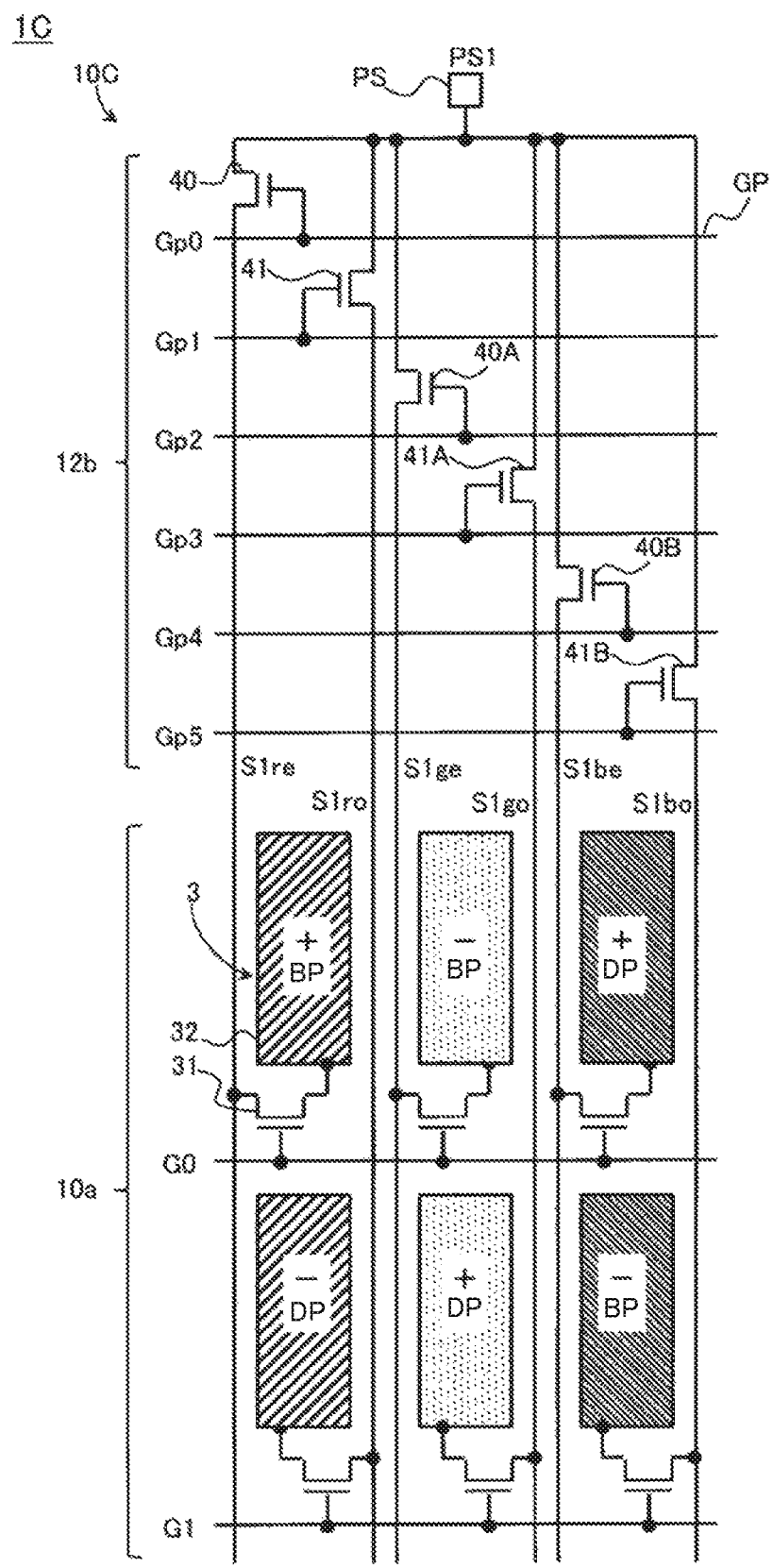
FIG. 13 is a circuit diagram of a display panel in a display device according to a fourth embodiment.

FIG. 13 is a circuit diagram of a display panel 10C of a display device 1C according to the fourth embodiment. The display panel 10C of the display device 1C according to the present embodiment has a configuration similar to that of the display panel 10 (FIG. 3) in the first embodiment, in which source lines SL for each specific set of 3 adjacent columns are connected to one corresponding input terminal PS via 6 switches 40, 41, 40A, 41A, 40B, and 41B as illustrated in FIG. 13. It is accordingly possible to reduce the circuit scale of a source drive circuit 12a (FIG. 2) by increasing the number of consolidated source lines SL to decrease the number of required input terminals PS.

The pixels 3 in the first to third columns are consolidated and connected to one input terminal PS. Like the configuration of the first embodiment, pixels 3 in the first column, pixels 3 in the second column, and pixels 3 in the third column represent R grayscale, G grayscale, and B grayscale, respectively. The switches 40, 41, 40A, 41A, 40B, and 41B for each specific set of three columns are connected to individual selection lines GP and turned on and off by individual control signals Gp0, Gp1, Gp2, Gp3, Gp4, and Gp5, respectively. An operation of the display device 1C according to the present embodiment will hereinafter be described with reference to FIG. 14.

Figure 14:
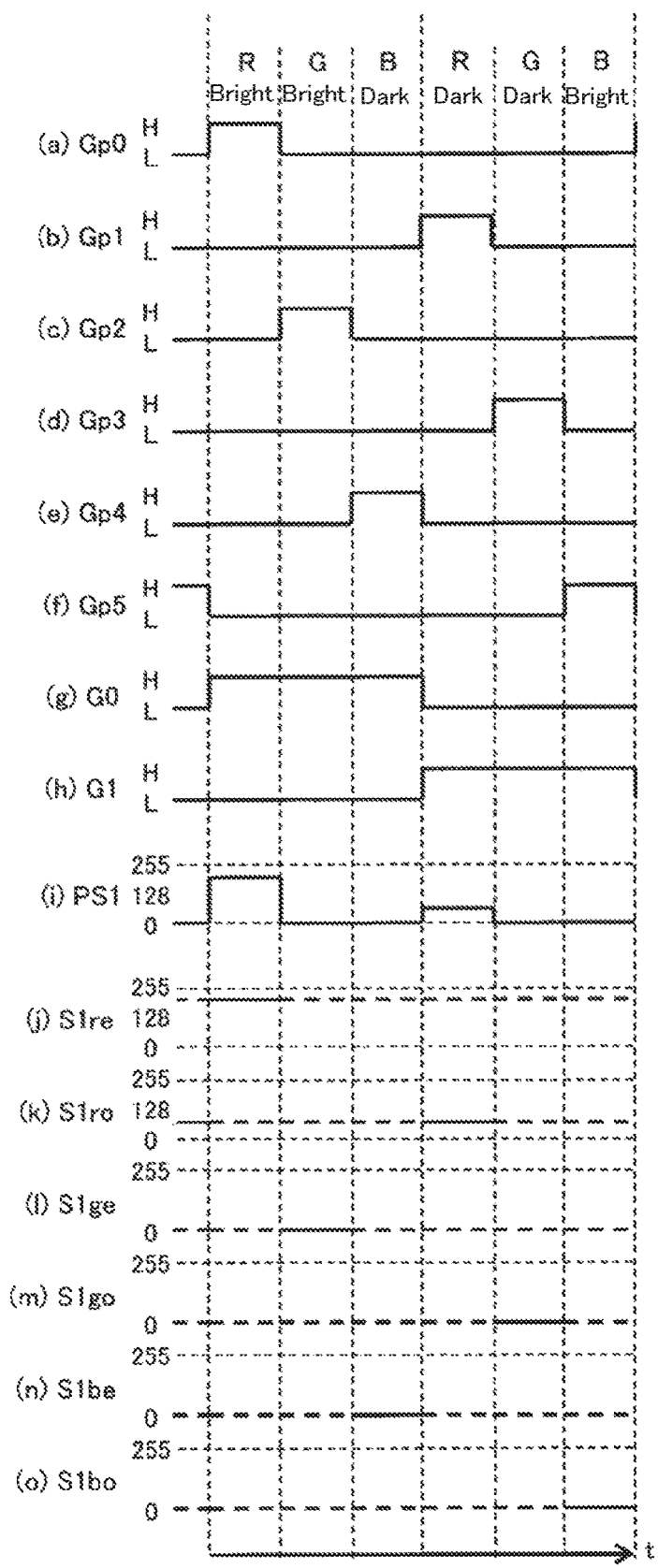
FIG. 14 is a timing diagram depicting an operation example of the display device according to the fourth embodiment.

Items (a) to (f) of FIG. 14 illustrate respective control timings of the control signal Gp0 to Gp5 for the switches 40 to 41B whose source lines SL are consolidated and connected to one input terminal PS. Items (g) and (h) of FIG. 14 illustrate respective operation timings of gate signals G0 and G1 in first and second rows. Item (i) of FIG. 14 illustrates an output timing of a source drive signal PS1. Items (j) to (o)

of FIG. 14 illustrate respective supply timings of source signals S1*re* and S1*ro*, S1*ge* and S1*go*, and S1*be* and S1*bo* on both sides in the first to third columns.

In order to charge the pixels 3 in the first, second, and third columns in the first row, the display device 1C first causes for example a gate drive section 11 (FIG. 1) to sequentially generate control signals Gp0, Gp2, and Gp4, thereby sequentially turning on the switches 40, 40A, and 40B on each left side in the first, second, and third columns (items (a), (c), and (e) of FIG. 14). The display device 1C then sequentially generates control signals Gp1, Gp3, and Gp5, thereby sequentially turning on the switches 41, 41A, and 41B on each right side in the first, second, and third columns (items (b), (d), and (f) of FIG. 14).

The gate drive section 11 of the display device 1C generates a gate signal G0 to select a gate line GL in the first row while the switches 40, 40A, and 40B on each left side for each column are sequentially turned on (item (g) of FIG. 14). The gate drive section 11 then generates a gate signal G1 to select a gate line GL in the second row while the switches 41, 41A, and 41B on each right side of each column are sequentially turned on (item (h) of FIG. 14).

Items (a) to (o) of FIG. 14 illustrate an operation example of the display device 1C when an input image is a red image in which each grayscale value is constant. The source drive circuit 12*a* (FIG. 2) of the display device 1C generates a source drive signal PS1 in synchronization with the control signals Gp0 to Gp5 (items (a), (b), and (i) of FIG. 14). Here, the source drive signal PS1 indicates a bright grayscale (red) when the switch 40 on the left side in the first column is turned on, and indicates a dark grayscale when the switch 41 on the right side in the first column is turned on.

The operation described above causes the source signals S1*re* to S1*bo* of the source lines SL for each specific set of columns in the display panel 10C to individually have respective voltages corresponding to bright and dark RGB while the source drive circuit 12*a* is performing time-sharing based color-expression ((i) of FIG. 14). This enables a reduction in the circuit scale of the source drive circuit 12*a* without causing problems such as color shift.

As described above, the display device 1C according to the present embodiment includes multi-color pixels 3 each of which indicates a grayscale of one color of specific RGB colors. Source lines SLe and SLo for each specific set of columns including multi-color pixels 3 are connected to the input terminal PS of a corresponding signal line PL of the source drive circuit 12*a* via corresponding switches 40 to 41B. This configuration enables a reduction in the circuit scale of the source drive circuit 12*a* without causing problems such as color shifts.

In the description described above, the source lines SLe and SLo for each specific set of columns including multi-color pixels 3 are consolidated via corresponding switches 40 to 41B. However, regardless of respective colors of the multi-color pixels 3, the source lines SL for each specific set of columns may be consolidated via appropriate switches. This configuration also enables a reduction in the circuit scale of the source drive circuit 12*a* by consolidation of the source lines S.

OTHER EMBODIMENTS

Although each of the display panels 10 to 10C in the embodiments described above has a double source structure in which two source lines SL are wired to pixels 3 for each column, the present invention is not limited to this. Three or more source lines SL may be wired to pixels 3 for each column. Part of all source lines SL for each column may be wired on a left of right side of pixels 3 in the column.

Although each of the display devices 1 to 1C in the embodiments described above includes a control circuit 2, a display device according to an aspect of the present invention may be provided for example in the form of an open cell separate from the control circuit 2.

A display device provided according to the present disclosure performs the brightness control in for example a double source structure, thereby enabling displaying an image in an easy-to-see manner. That is, the display device includes pixels, source lines, and a controller. The pixels are arranged in a matrix and form a display area for displaying an image. The source lines are arranged in a column direction of the matrix of the pixels on the display area and connected to the pixels. The controller performs image control of the image to be displayed on the display area. Of the source lines, prescribed source lines are wired to pixels in an identical column of the matrix. The prescribed source lines connected to the pixels in the identical column are individually connected to adjacent pixels for each pair in the identical column. The controller controls a grayscale for each of the pixels in the image so that one of adjacent pixels for each pair in the column direction has a grayscale greater than or equal to a grayscale the other has. This enables the display device to display an image in an easy-to-see manner.

Although specific embodiments and variations according to an aspect of the present invention have been described above, the present invention is not limited to such forms and may be implemented in various manners within a scope of the present invention. For example, elements of configuration from individual embodiments described above may be combined as one embodiment of the present invention.

REFERENCE SIGNS LIST

1 Display device
2 Control circuit
3 Pixel
10*a* Display area
12 Source drive section
12*a* Source drive circuit
12*b* S-GOA section
40 to 43, 40A to 40B, 41A to 41B Switch
CS Auxiliary capacitor
GL Gate line
SL, SLe, SLo Source line
PL Signal line

The invention claimed is:
1. A display device, comprising
pixels that are arranged in a matrix and form a display area for displaying an image;
source lines that are wired in a column direction of the matrix of the pixels on the display area and connected to the pixels;
a source drive circuit including signal lines that allow signals to be supplied therefrom to the pixels via the source lines;
switches provided between the source lines and the signal lines;
gate lines that are wired in a row direction of the matrix of the pixels and connected to the pixels; and
a gate drive section configured to sequentially select between the gate lines to drive a selected gate line of the gate lines at predetermined regular intervals, wherein of the source lines, two source lines are wired to, of the pixels, prescribed pixels in an identical column of the matrix, the two source lines to the prescribed pixels in the identical column are connected to one signal line of the signal lines of the source drive circuit via one or more switches of the switches, the switches switch between the source lines connected to a corresponding signal line of the signal lines at the predetermined regular intervals, the display device further comprises a controller configured to perform image control of an image to be displayed on the display area, the prescribed pixels in the identical column of the matrix include pixel groups each including a first pixel and a second pixel adjacent to each other, the controller controls a grayscale for each of the pixels in the image to be displayed on the display area so that of a first pixel and a second pixel included in an identical pixel group of the pixel groups, the first pixel has a grayscale value greater than or equal to a grayscale value of the second pixel, the prescribed pixels in the identical column of the matrix are connected to different gate lines of the gate lines, and one source line of the two source lines connected to the prescribed pixels in the identical column of the matrix is connected to each of the first pixels included in the prescribed pixels in the identical column of the matrix and the other source line of the two source lines connected to the prescribed pixels in the identical column of the matrix is connected to each of the second pixels included in the prescribed pixels in the identical column of the matrix.

2. The display device according to claim 1, wherein the switches are provided in a predetermined area on a periphery of the display area.

3. The display device according to claim 1, wherein the source drive circuit outputs a signal with respect to a pixel selected by the gate drive section at the predetermined regular intervals, the gate drive section drives the selected gate line during a predetermined period longer than the predetermined regular intervals, and the predetermined period includes a floating period during which a source line of the source lines connected to the selected pixel is in a floating state without being connected to a corresponding one of the signal lines.

4. The display device according to claim 3, further comprising auxiliary capacitors that are individually connected to the source lines, the auxiliary capacitors being configured to flatten respective voltage distributions in the source lines that are in a floating state without being connected to respective corresponding signal lines.

5. The display device according to claim 1, wherein of the switches, prescribed switches are provided for each of the source lines.

6. The display device according to claim 1, wherein the pixels include multi-color pixels each of which indicates a grayscale of one color of specific colors, and of the source lines, prescribed source lines for each specific set of columns including the specific colors are connected to one corresponding signal line of the signal lines of the source drive circuit via, of the switches, prescribed switches.

7. The display device according to claim 1, wherein the first pixel and the second pixel included in the identical pixel group have different timings with which selection by the gate drive section starts.

8. The display device according to claim 7, wherein in the gate drive section starting selection of the first pixels and then starting selection of the second pixels, each of corresponding switches of the switches connects the one source line to the one signal line and then connects the other source line to the one signal line in a corresponding column of the columns of the matrix, and in the gate drive section starting the selection of the second pixels and then starting the selection of the first pixels, each of the corresponding switches of the switch connects the other source line to the one signal line and then connects the one source line to the one signal line in a corresponding column of the columns of the matrix.

9. The display device according to claim 8, wherein a first period in which the gate drive section selects the first pixels partly overlaps with a second period in which the gate drive section selects the second pixels, when the gate drive section starts the selection of the second pixels after starting the selection of the first pixels, each of the corresponding switches of the switches connects the other source line to the one signal line in the corresponding column of the matrix in a period in which the first period overlaps with the second period, and when the gate drive section starts the selection of the first pixels after starting the selection of the second pixels, each of the corresponding switches of the switches connects the one source line to the one signal line in the corresponding column of the matrix in the period in which the first period overlaps with the second period.

10. The display device according to claim 3, wherein the floating period is subsequent to a period during which a source line of the source line connected to the selected pixel is connected to a corresponding one of the signal lines.

11. The display device according to claim 3, wherein the predetermined period is twice the predetermined regular intervals.

* * * * *